(12) United States Patent
Nakayama et al.

(10) Patent No.: US 9,966,247 B2
(45) Date of Patent: May 8, 2018

(54) CONTROL SYSTEM AND CONTROL METHOD FOR COMPONENT MOUNTING MACHINE

(75) Inventors: Yukinori Nakayama, Hekinan (JP); Hideyasu Takamiya, Chiryu (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 547 days.

(21) Appl. No.: 14/425,151

(22) PCT Filed: Sep. 6, 2012

(86) PCT No.: PCT/JP2012/072816
§ 371 (c)(1),
(2), (4) Date: Mar. 2, 2015

(87) PCT Pub. No.: WO2014/038053
PCT Pub. Date: Mar. 13, 2014

(65) Prior Publication Data
US 2015/0206735 A1 Jul. 23, 2015

(51) Int. Cl.
*B23P 19/00* (2006.01)
*H01L 21/02* (2006.01)
(Continued)

(52) U.S. Cl.
CPC ............ *H01L 21/02* (2013.01); *G05B 19/418* (2013.01); *H01L 21/67144* (2013.01);
(Continued)

(58) Field of Classification Search
CPC ... H01L 21/02; H01L 24/75; H01L 21/67144; H01L 2224/75745; H01L 2224/759;
(Continued)

(56) References Cited

U.S. PATENT DOCUMENTS 7,003,872 B2 * 2/2006 Mimura ................. H05K 13/08
29/832
7,350,289 B2 * 4/2008 Narita ................ H05K 13/0413
29/739
8,046,907 B2 * 11/2011 Sumi .................. H05K 13/0452
29/739

FOREIGN PATENT DOCUMENTS

JP 2003 234597 8/2003
JP 2009 94296 4/2009
(Continued)

OTHER PUBLICATIONS

International Search Report dated Dec. 11, 2012 in PCT/JP12/072816 Filed Sep. 6, 2012.

*Primary Examiner* — Donghai D Nguyen
(74) *Attorney, Agent, or Firm* — Oblon, McClelland, Maier & Neustadt, L.L.P.

(57) ABSTRACT

A wafer component supply device supplying a wafer component and a feeder, such as a tape feeder supplying an electronic component, are set in a component mounting machine. When the wafer component is to be inverted and mounted on a circuit substrate, the wafer component supply device allows the wafer component present on an inverted supply head to be sucked by a mounting head of the component mounting machine at a position where the supply head and a stage are moved down by a vertical movement mechanism. An order of an operation for inverting the wafer component and mounting the wafer component on the circuit substrate and an operation for mounting the feeder component on the circuit substrate is set so that the supply head and the mounting head do not interfere with each other; and an operation for moving down the supply head and the stage, allowing the wafer component to be sucked by the supply head, and inverting the wafer component is per-
(Continued)

formed so as to overlap with an operation for sucking and mounting the feeder component by the mounting head.

6 Claims, 11 Drawing Sheets

(51) Int. Cl.
*H01L 21/67* (2006.01)
*H01L 23/00* (2006.01)
*G05B 19/418* (2006.01)

(52) U.S. Cl.
CPC .... *H01L 24/75* (2013.01); *G05B 2219/45032* (2013.01); *H01L 2224/759* (2013.01); *H01L 2224/75745* (2013.01); *Y10T 29/53178* (2015.01)

(58) Field of Classification Search
CPC ........ G05B 19/418; G05B 2219/45032; Y10T 29/49131; Y10T 29/49133; Y10T 29/53061; Y10T 29/53174; Y10T 29/59178
USPC ........................... 29/832–834, 714, 739, 740
See application file for complete search history.

(56) References Cited

FOREIGN PATENT DOCUMENTS

| | | |
|---|---|---|
| JP | 2010 129949 | 6/2010 |
| JP | 2011 66162 | 3/2011 |
| JP | 2012 33592 | 2/2012 |
| JP | 2012 104636 | 5/2012 |
| JP | 2012 156413 | 8/2012 |

\* cited by examiner

CONTROL SYSTEM AND CONTROL METHOD FOR COMPONENT MOUNTING MACHINE

TECHNICAL FIELD

The present application relates to a system and method of controlling a component mounting machine which set a wafer component supply device supplying a wafer component (die) formed by dicing one wafer attached onto a dicing sheet and a feeder supplying an electronic component in a component mounting machine and mount the components supplied from the wafer component supply device and the feeder on a circuit substrate.

BACKGROUND ART

As disclosed in, for example, PTL 1 (JP-A-2003-234597), a component mounting machine is adapted so that plural kinds of feeders are set in a body of the mounting machine and an electronic component supplied from each feeder is sucked and mounted on a circuit substrate by a mounting head. PTL 1 discloses a tape feeder, a bulk feeder, a stick feeder, a tray feeder, and the like as a feeder. However, in recent years, there has been an apparatus in which a wafer component supply device supplying a wafer component is set in a component mounting machine and the wafer component is mounted on a circuit substrate by a mounting head of the component mounting machine as disclosed in PTL 2 (JP-A-2010-129949). The wafer component supply device is adapted to suck and pick up a wafer component, which is attached onto a dicing sheet, by a supply head of the wafer component supply device or a mounting head of the component mounting machine.

CITATION LIST

Patent Literature

PTL 1: JP-A-2003-234597
PTL 2: JP-A-2010-129949

SUMMARY

Technical Problem

Incidentally, the wafer components are formed by dicing one wafer attached onto a dicing sheet, but there is a case in which the wafer components are attached to the dicing sheet so that the mounting surfaces of the wafer components face upward. For this purpose, the wafer component supply device of PTL 2 includes an inverting mechanism that inverts the wafer component picked up from the dicing sheet and a conveyor that conveys the inverted wafer component to a predetermined position, and is adapted to suck the wafer component, which is conveyed by the conveyor, by the mounting head of the component mounting machine and to mount the wafer component on a circuit substrate. However, when the wafer component supply device includes the inverting mechanism and the conveyor, the size of the wafer component supply device is increased or the time required to suck, invert, and mount the wafer component is lengthened. For this reason, there is a drawback that production efficiency is lowered.

Accordingly, the applicant of this application is developing a wafer component supply device that is adapted to invert a supply head having sucked a wafer component and to allow the wafer component present on the supply head to be sucked by a mounting head of a component mounting machine. In this case, since the height position of the wafer component, which is present on the inverted supply head, needs to correspond to the suction height position of the mounting head of the component mounting machine, a vertical movement mechanism, which moves the supply head of the wafer component supply device or a stage on which a wafer pallet is set in a vertical direction is provided. Accordingly, when the wafer component is to be inverted and mounted on a circuit substrate, the wafer component present on the inverted supply head is sucked by the mounting head of the component mounting machine at a position where the supply head and the stage are moved down by the vertical movement mechanism. When the wafer component is to be mounted on the circuit substrate without being inverted, the wafer component of the wafer pallet present on the stage is sucked by the mounting head of the component mounting machine at a position where the supply head and the stage are moved up by the vertical movement mechanism.

When this wafer component supply device is set in a component mounting machine together with another feeder and a wafer component or a component supplied from the feeder is to be mounted on a circuit substrate, the interference (collision) between the mounting head of the component mounting machine and the supply head of the wafer component supply device needs to be avoided. For this reason, if the heads interfere with each other when the mounting head and the supply head are simultaneously operated, the operation of one head needs to be controlled to stop until the completion of the operation of the other head so that the interference between the heads is prevented. As a result, production efficiency is lowered.

Solution to Problem

In order to solve the problem, according to the present disclosure, there is provided a system setting a wafer component supply device, which supplies a wafer component formed by dicing one wafer attached onto a dicing sheet, and a feeder, which supplies an electronic component, in a component mounting machine and controlling operations of the component mounting machine, the wafer component supply device, and the feeder according to a production job (production program) to suck any one of the wafer component supplied from the wafer component supply device and the electronic component (hereinafter, referred to as a "feeder component") supplied from the feeder and mount any one of the wafer component and the feeder component on a circuit substrate. The component mounting machine includes a mounting head that sucks any one of the wafer component and the feeder component supplied from the wafer component supply device and the feeder and mounts any one of the wafer component and the feeder component on the circuit substrate. The wafer component supply device includes a supply head that sucks and inverts the wafer component and a vertical movement mechanism that moves the supply head in a vertical direction integrally with a stage on which a pallet for the wafer component is set. When the wafer component is to be inverted and mounted on the circuit substrate, the wafer component present on the inverted supply head is sucked by the mounting head of the component mounting machine at a position where the supply head and the stage are moved down by the vertical movement mechanism. When the wafer component is to be mounted on the circuit substrate without being inverted, the wafer component present on the stage is sucked by the mounting head of the component mounting machine at a position where the supply head and the stage are moved up by the vertical movement mechanism. The system sets an order of an operation for inverting the wafer component and mounting the wafer component on the circuit substrate and an operation for mounting the feeder component on the circuit substrate so that the supply head and the mounting head do not interfere with each other, and performs an operation for moving down the supply head and the stage, allowing the wafer component to be sucked by the supply head, and inverting the wafer component so that the operation overlaps with an operation for sucking and mounting the feeder component by the mounting head.

In this case, the interference between the supply head and the mounting head can be prevented and an operation for sucking and inverting the wafer component can be performed so as to overlap with an operation for sucking and mounting the feeder component. Therefore, if the operation for sucking and inverting the wafer component is completed by the completion of the operation for sucking and mounting the feeder component, an operation for mounting the wafer component can be started immediately after the completion of the operation for sucking and mounting the feeder component. Alternatively, if the operation for sucking and inverting the wafer component is not completed by the completion of the operation for sucking and mounting the feeder component, the operation for mounting the wafer component can be started immediately after the completion of the operation for sucking and inverting the wafer component. Accordingly, the waiting time for the start of the operation for mounting the wafer component can be reduced, so that production efficiency can be improved.

In this case, when the time required for the operation for sucking and inverting one wafer component by the supply head is longer than the time required for the operation for sucking and mounting one feeder component by the mounting head, a component mounting order may be set so that operations for sucking and mounting two or more feeder components are continuously performed until the completion of the operation for sucking and inverting the wafer component. In this case, it is possible to eliminate the waiting time for the start of the operation for mounting the wafer component even when the time required for the operation for sucking and inverting one wafer component by the supply head is longer than the time required for an operation for sucking and mounting one feeder component by the mounting head.

Further, the wafer component supply device may include a camera that takes an image of the wafer component before sucking the wafer component by the supply head, and may be adapted to recognize the position of the wafer component through the processing of the image taken by the camera and to suck the wafer component by the supply head. In this case, since image processing for recognizing the position of the wafer component can also be performed so as to overlap with the operation for sucking and mounting the feeder component, it is possible to prevent the delay of the start of the operation for mounting the wafer component that is caused by the image processing for recognizing the position of the wafer component.

Furthermore, the wafer component supply device may include a knock-up mechanism for knocking up a portion of the dicing sheet, which is to be sucked by the supply head, from below when the wafer component is sucked by the supply head. In this case, since the wafer component is easily separated from the dicing sheet when the wafer component is sucked by the supply head, it is possible to reliably prevent the suction failure of the wafer component.

DESCRIPTION OF EMBODIMENTS

Figure 1:
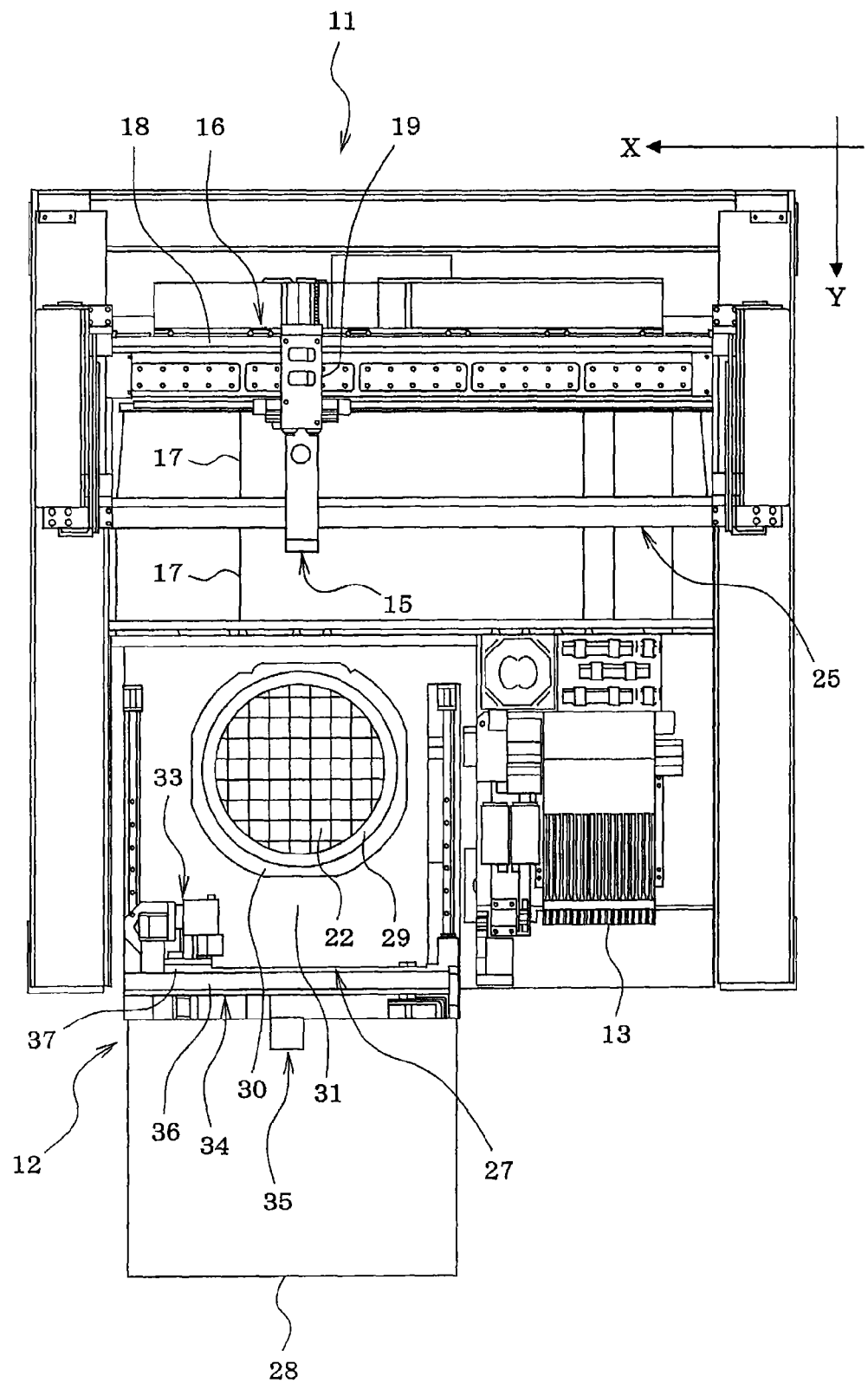
FIG. 1 is a plan view showing a state in which a wafer component supply device is set in a component mounting machine according to an embodiment of the present disclosure.
Figure 2:
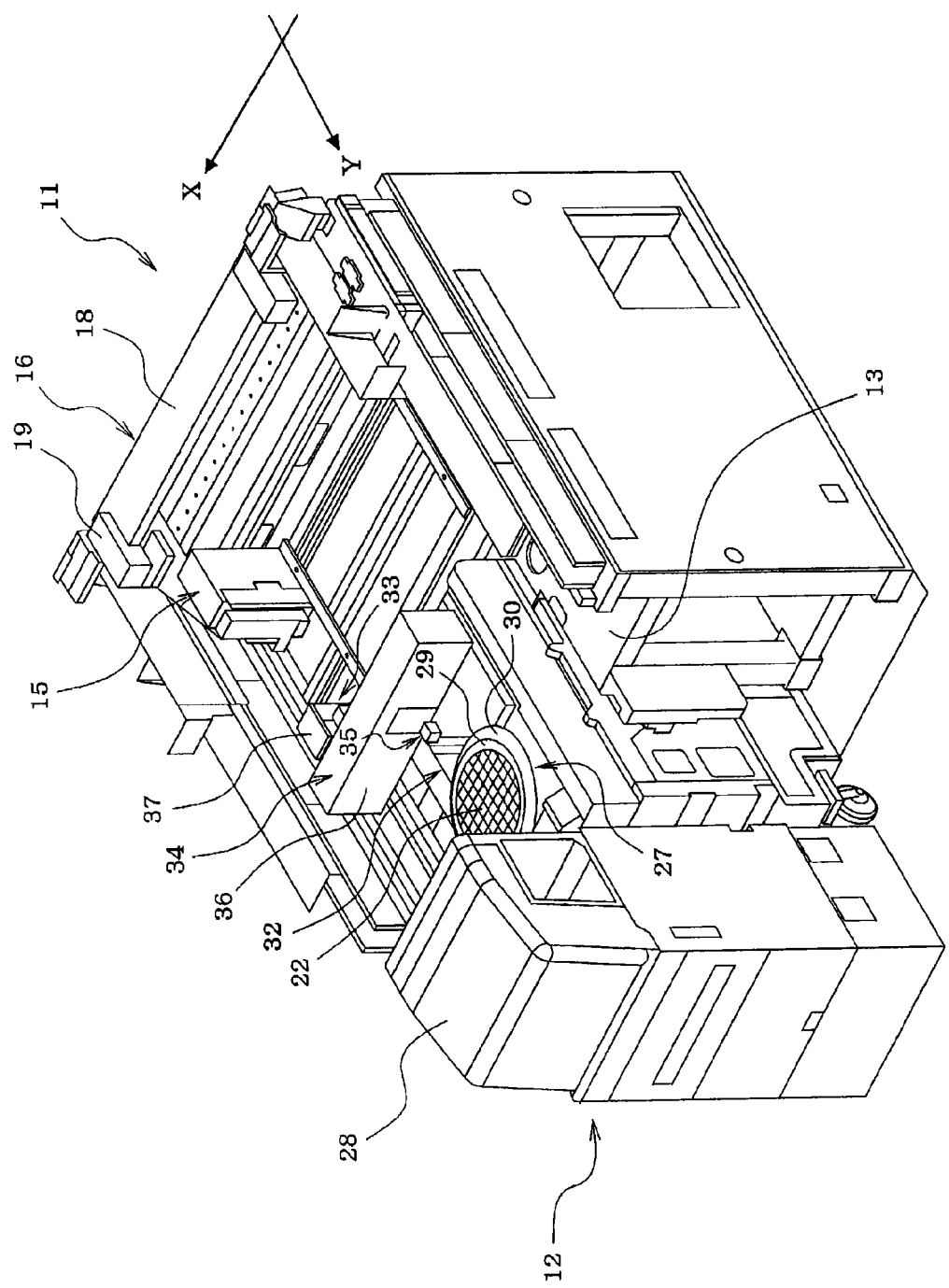
FIG. 2 is an external perspective view showing a state in which the wafer component supply device is set in the component mounting machine.
Figure 3:
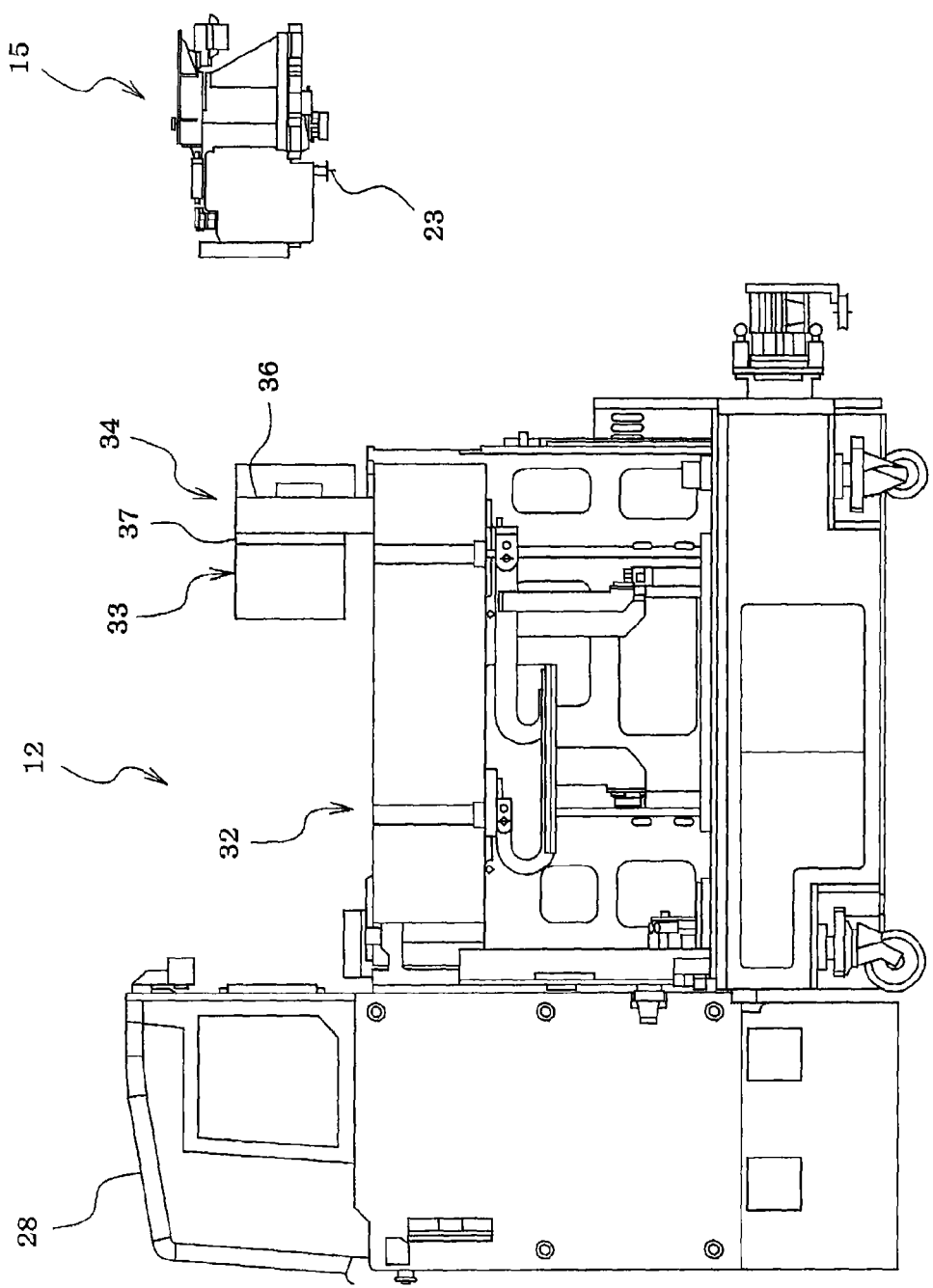
FIG. 3 is a side view showing a positional relationship between the wafer component supply device and a mounting head of the component mounting machine when the wafer component supply device is set in the component mounting machine.

An embodiment of the present disclosure will be described below. As shown in FIGS. 1 and 2, a wafer component supply device 12 is detachably set in a component mounting machine 11. A feeder setting base 13 is provided in the component mounting machine 11 so as to be adjacent to the set position of the wafer component supply device 12, and a feeder (not shown), such as a tape feeder, is detachably set on the feeder setting base 13. The feeder, which is set on the feeder setting base 13, is not limited to a tape feeder, and may be a bulk feeder, a stick feeder, or the like. Among these feeders, plural kinds of feeders may be set on the feeder setting base 13.

The component mounting machine 11 is provided with an X-Y moving mechanism 16 (X-Y robot) that moves amounting head 15 in an X direction and a Y direction (a lateral direction and a longitudinal direction). The X-Y moving mechanism 16 includes a Y slide 18 that slides in the Y direction (a direction orthogonal to the conveying direction of a circuit substrate 17) and an X slide 19 that is supported by the Y slide 18 so as to be slidable in the X direction (the conveying direction of the circuit substrate 17), and the mounting head 15 is supported by the X slide 19.

The mounting head 15 of the component mounting machine 11 is provided with a suction nozzle 23 (see FIGS. 3 to 8) that sucks a wafer component 22 supplied from the wafer component supply device 12 or an electronic component (hereinafter, referred to as a "feeder component") supplied from the feeder, a mark camera (not shown) that takes the image of an object to be imaged, such as a reference mark of the circuit substrate 17, from above, and the like.

The component mounting machine 11 is provided with two conveyors 25 that convey the circuit substrates 17, and apart camera 26 (see FIGS. 3 to 8) for taking the image of the wafer component 22 or the feeder component, which is sucked by the suction nozzle 23 of the mounting head 15, from below is provided at a position between the conveyor 25 and the wafer component supply device 12 (or the feeder) so as to face upward.

Figure 10:
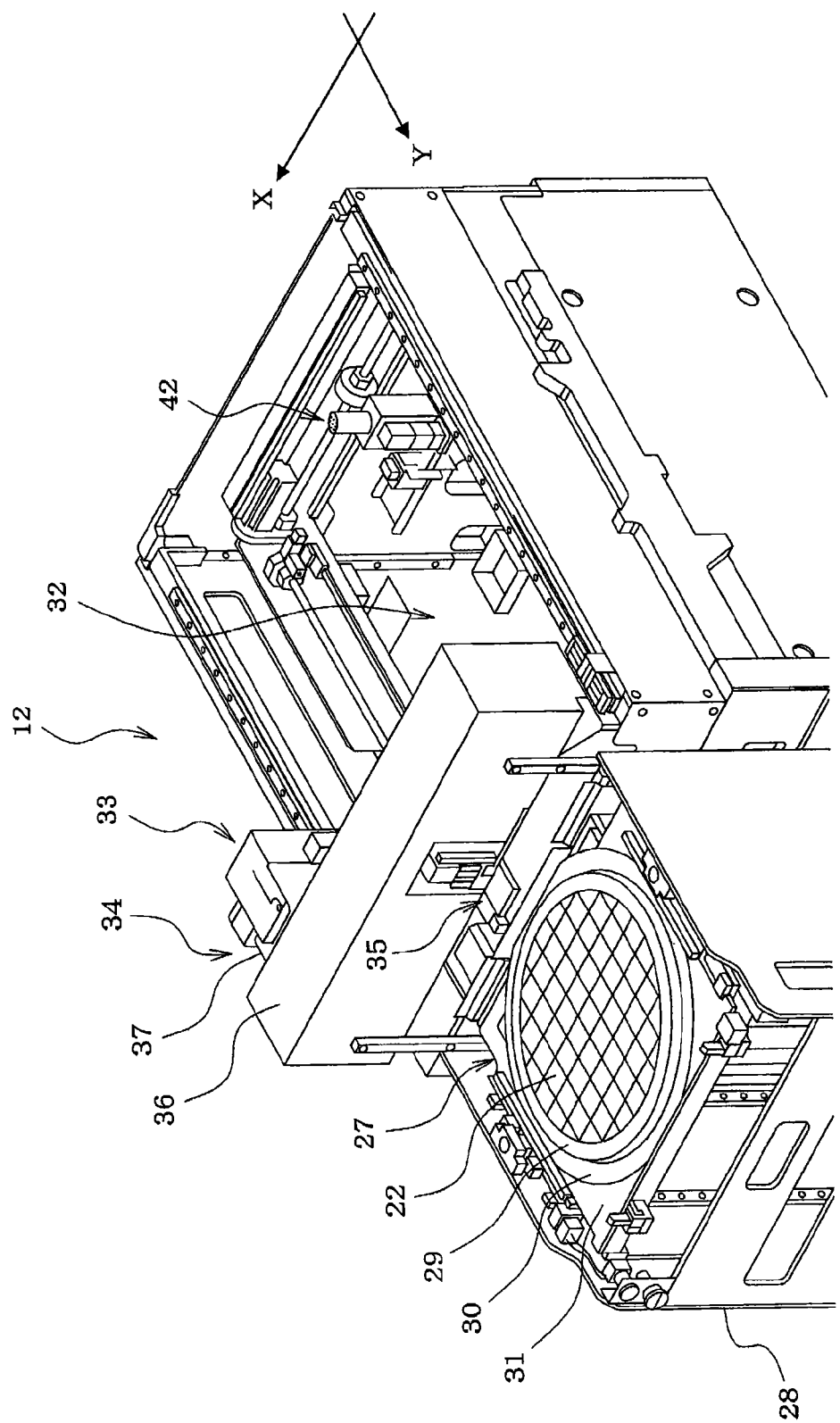
FIG. 10 is an external perspective view obliquely showing a state, in which a wafer pallet is not drawn onto the stage from a magazine of the wafer component supply device, from above.
Figure 11:
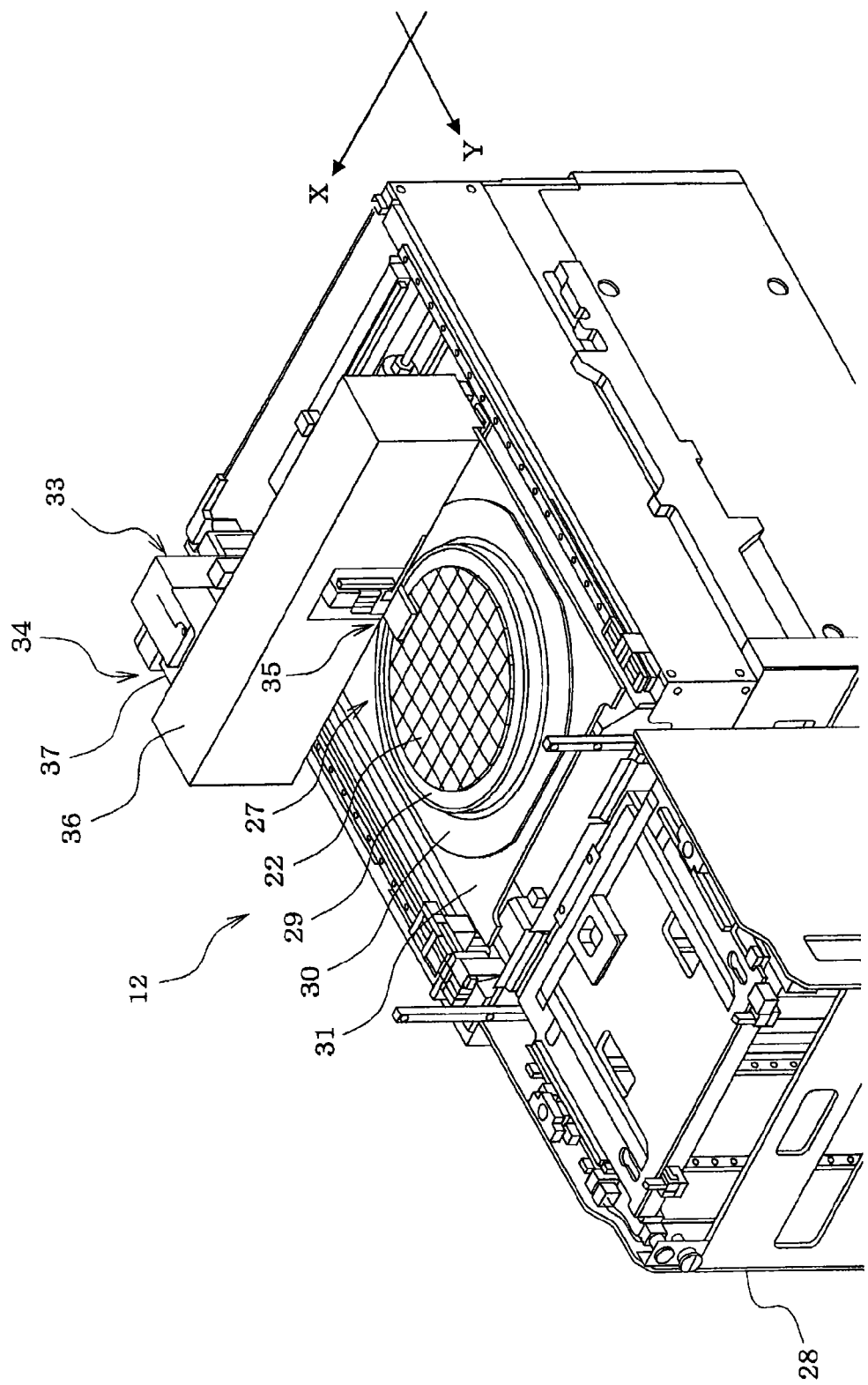
FIG. 11 is an external perspective view obliquely showing a state, in which the wafer pallet is drawn onto the stage from the magazine of the wafer component supply device, from above.

Meanwhile, the wafer component supply device 12 is provided with a magazine 28 that stores wafer pallets 27 in a plurality of stages. As shown in FIGS. 10 and 11, the wafer pallet 27 has a structure in which an expandable dicing sheet 29 to which a wafer diced so as to be divided into a plurality of wafer components 22 is attached is mounted on a dicing frame 30 including a circular opening so as to expand and the dicing frame 30 is mounted on a pallet body 31 by screwing or the like. The wafer component supply device 12 is provided with a drawing mechanism 35 that draws the wafer pallet 27 onto a stage 32 from the magazine 28.

Figure 9:
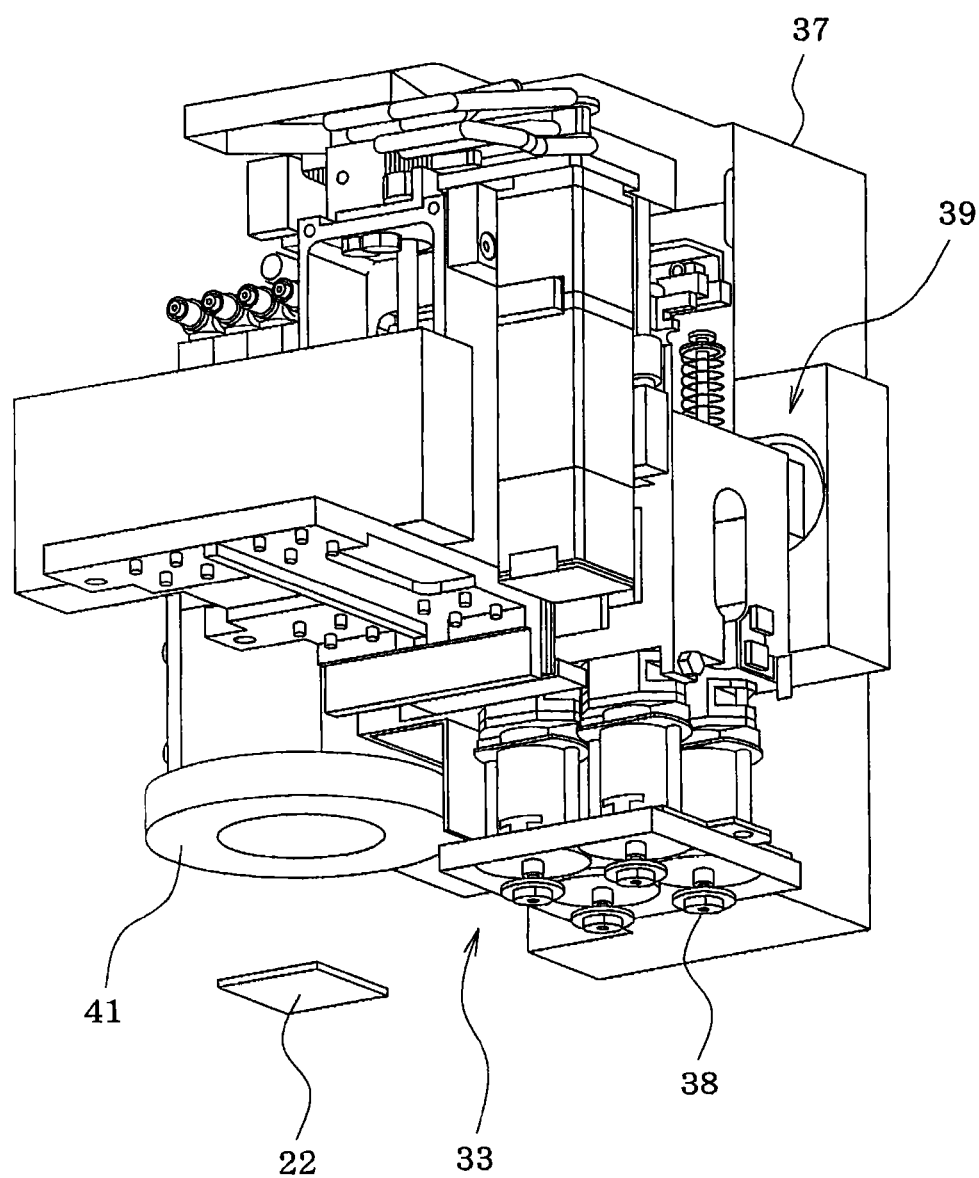
FIG. 9 is an external perspective view of the supply head of the wafer component supply device that is seen obliquely from below.

Further, the wafer component supply device 12 is provided with an X-Y moving mechanism 34 (X-Y robot) that moves a supply head 33 in the X direction and the Y direction (the lateral direction and the longitudinal direction). The X-Y moving mechanism 34 includes a Y slide 36 that slides in the Y direction and an X slide 37 that is supported by the Y slide 36 so as to be slidable in the X direction. The supply head 33 is supported by the X slide 37 so as to be capable of being inverted, and one or a plurality of suction nozzles 38 (see FIG. 9) are supported by the supply head 33 so as to be capable of moving in the vertical direction. The supply head 33 of the wafer component supply device 12 is used when the wafer components 22 are attached to the dicing sheet 29 of the wafer pallet 27 so that mounting surfaces of the wafer components 22 face upward. The supply head 33 is adapted to be inverted by an inverting mechanism 39 (see FIG. 9) to invert the wafer component 22 after the suction of the wafer components 22 onto the suction nozzles 38 of the supply head 33, and to allow the wafer component 22 to be sucked by the suction nozzle 23 of the mounting head 15 of the component mounting machine 11.

Figure 7:
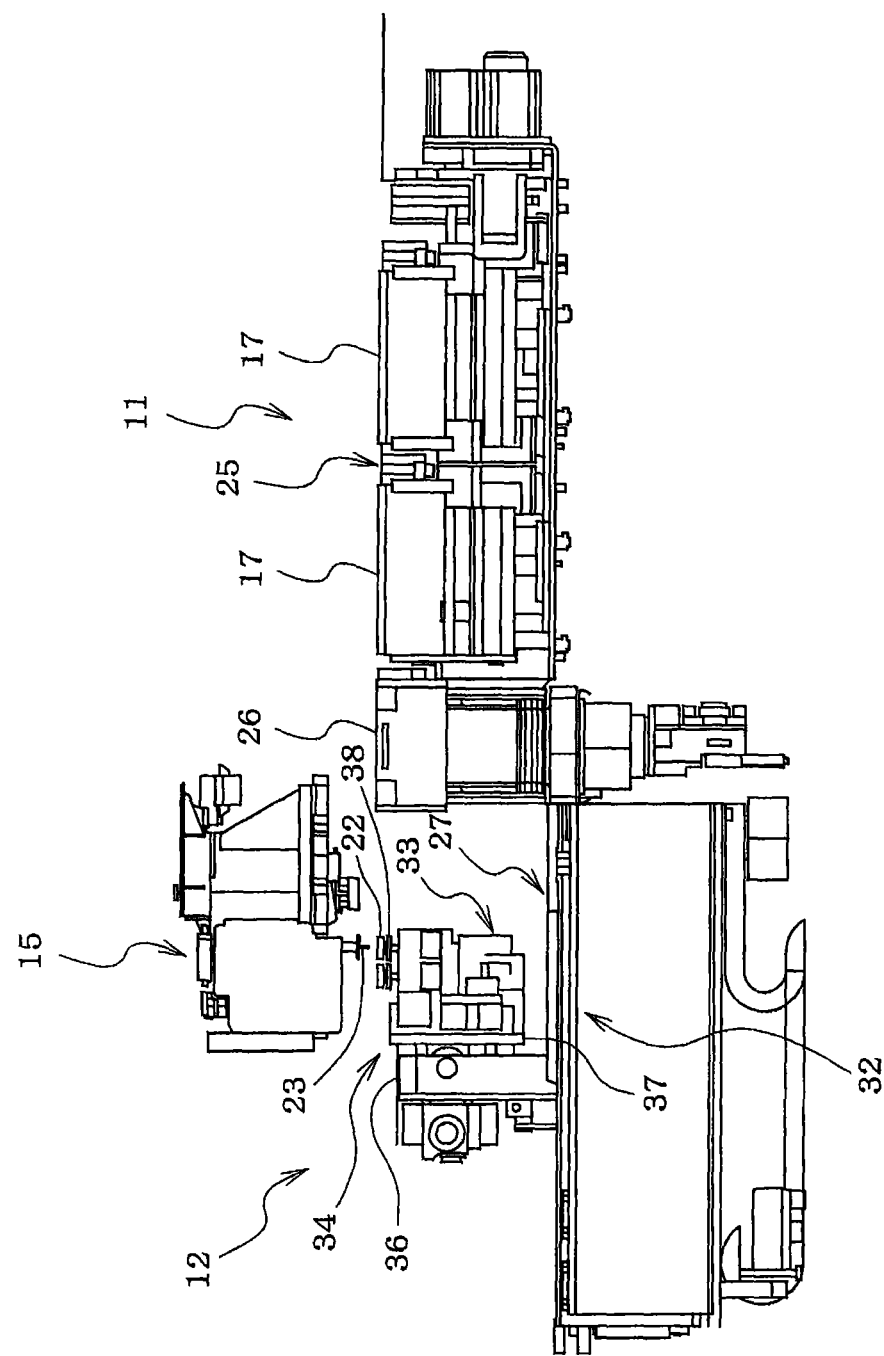
FIG. 7 is a side view showing a state in which a wafer component present on the inverted supply head is sucked by the mounting head of the component mounting machine.

In this case, since the height position of the wafer component 22, which is present on the inverted supply head 33, needs to correspond to the suction height position of the mounting head 15 of the component mounting machine 11, a vertical movement mechanism (not shown), which moves the supply head 33 of the wafer component supply device 12 in a vertical direction integrally with the stage 32 on which the wafer pallet 27 is set, is provided. Accordingly, when the wafer component 22 is to be inverted and mounted on the circuit substrate 17, the wafer component 22 present on the inverted supply head 33 is sucked by the mounting head 15 of the component mounting machine 11 at a position where the supply head 33 and the stage 32 are moved down by the vertical movement mechanism as shown in FIG. 7.

Figure 8:
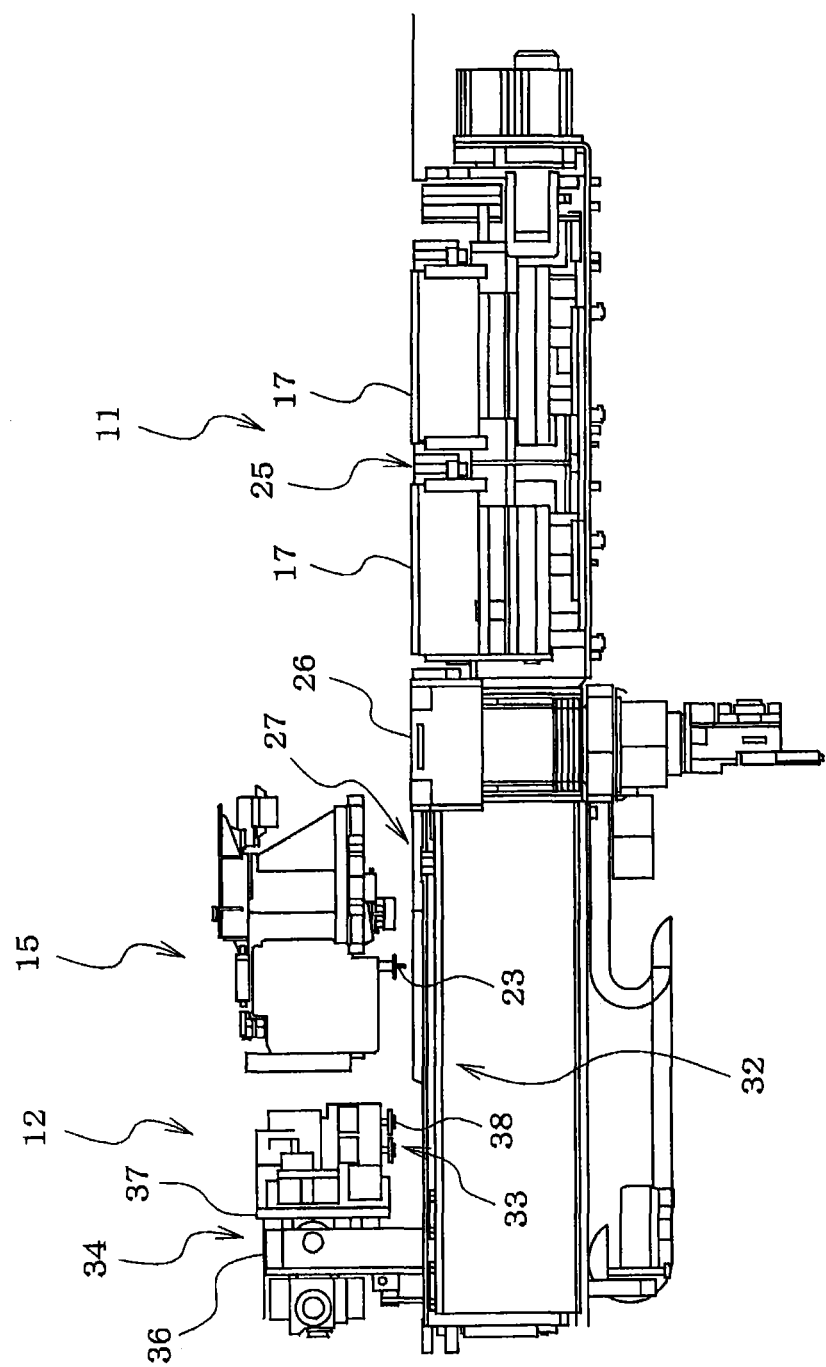
FIG. 8 is a side view showing a state in which a wafer component of a wafer pallet present on the stage of the wafer component supply device is directly sucked by the mounting head of the component mounting machine.

Meanwhile, when the wafer components 22 are attached onto the dicing sheet 29 of the wafer pallet 27 so that the mounting surfaces of the wafer components 22 face downward, the wafer components 22 are mounted on the circuit substrate 17 without being inverted. In this case, as shown in FIG. 8, the wafer component 22 of the wafer pallet 27 present on the stage 32 is sucked by the suction nozzle 23 of the mounting head 15 of the component mounting machine 11 at a position where the supply head 33 and the stage 32 are moved up by the vertical movement mechanism.

The supply head 33 of the wafer component supply device 12 is provided with a camera 41 (see FIG. 9) that takes the image of a wafer component 22 before the suction of the wafer component 22 onto the suction nozzle 38 of the supply head 33, and is adapted to recognize the position of the wafer component 22 through the processing of the image taken by the camera 41 and to allow the wafer component 22 to be sucked by the suction nozzle 38 of the supply head 33. Further, when the position of the wafer component 22 is to be recognized on the basis of the result of the processing of the image taken by the camera 41, it is determined whether or not the wafer component 22 is a defective product. If it is determined that the wafer component 22 is a defective product, the wafer component 22 is not sucked and the processing of the image of an adjacent wafer component 22 is performed.

Furthermore, the wafer component supply device 12 is provided with a knock-up mechanism 42 (see FIG. 10) for knocking up a portion of the dicing sheet 29, which is to be sucked by the suction nozzle 38, from below when the wafer component 22 is sucked by the suction nozzle 38 of the supply head 33. The knock-up mechanism 42 is adapted to move in the vertical direction while interlocking with the vertical movement of the stage 32.

Figure 5:
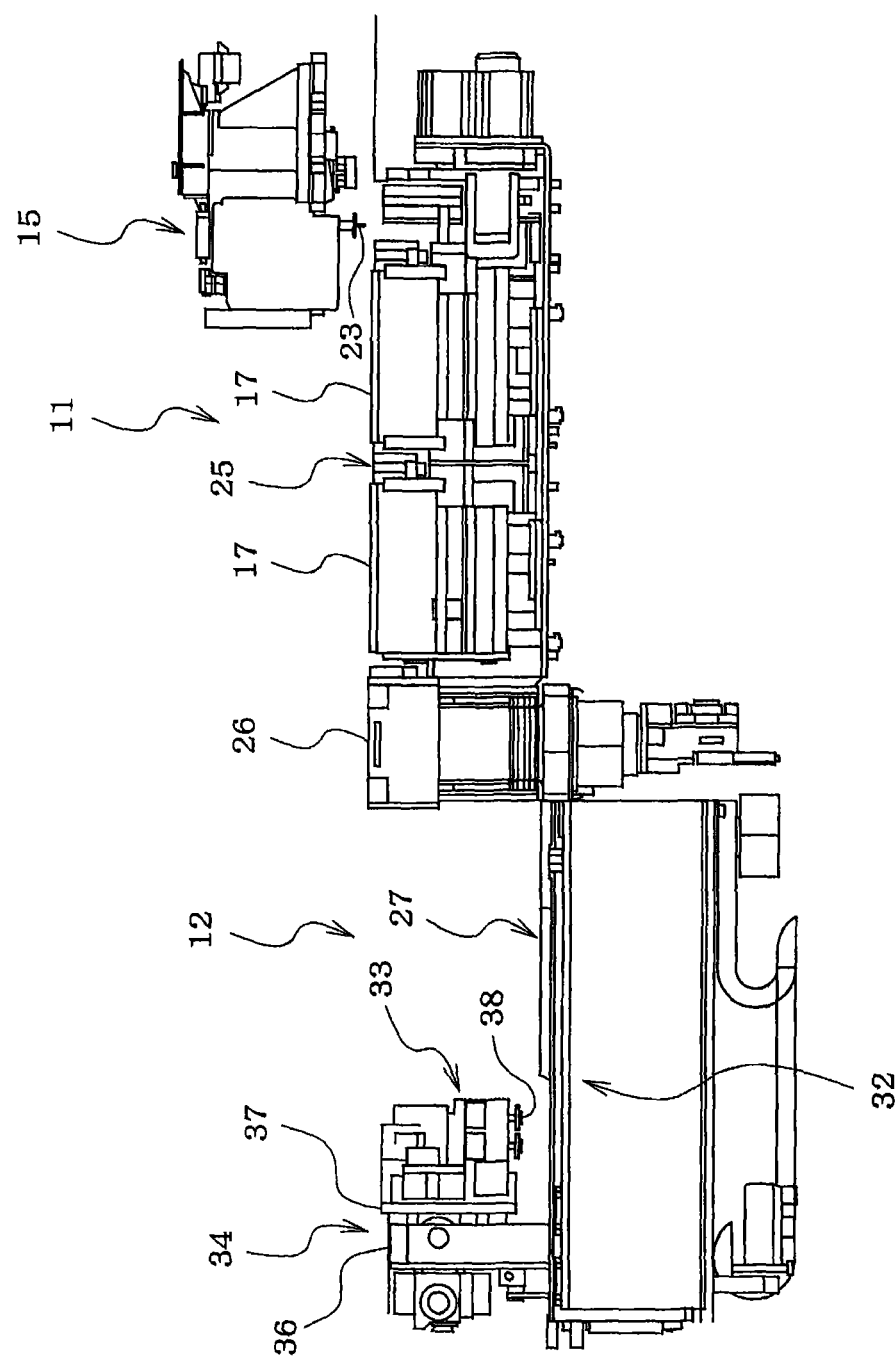
FIG. 5 is a side view showing a height positional relationship between the supply head and the mounting head of the component mounting machine when the stage of the wafer component supply device is moved down.
Figure 6:
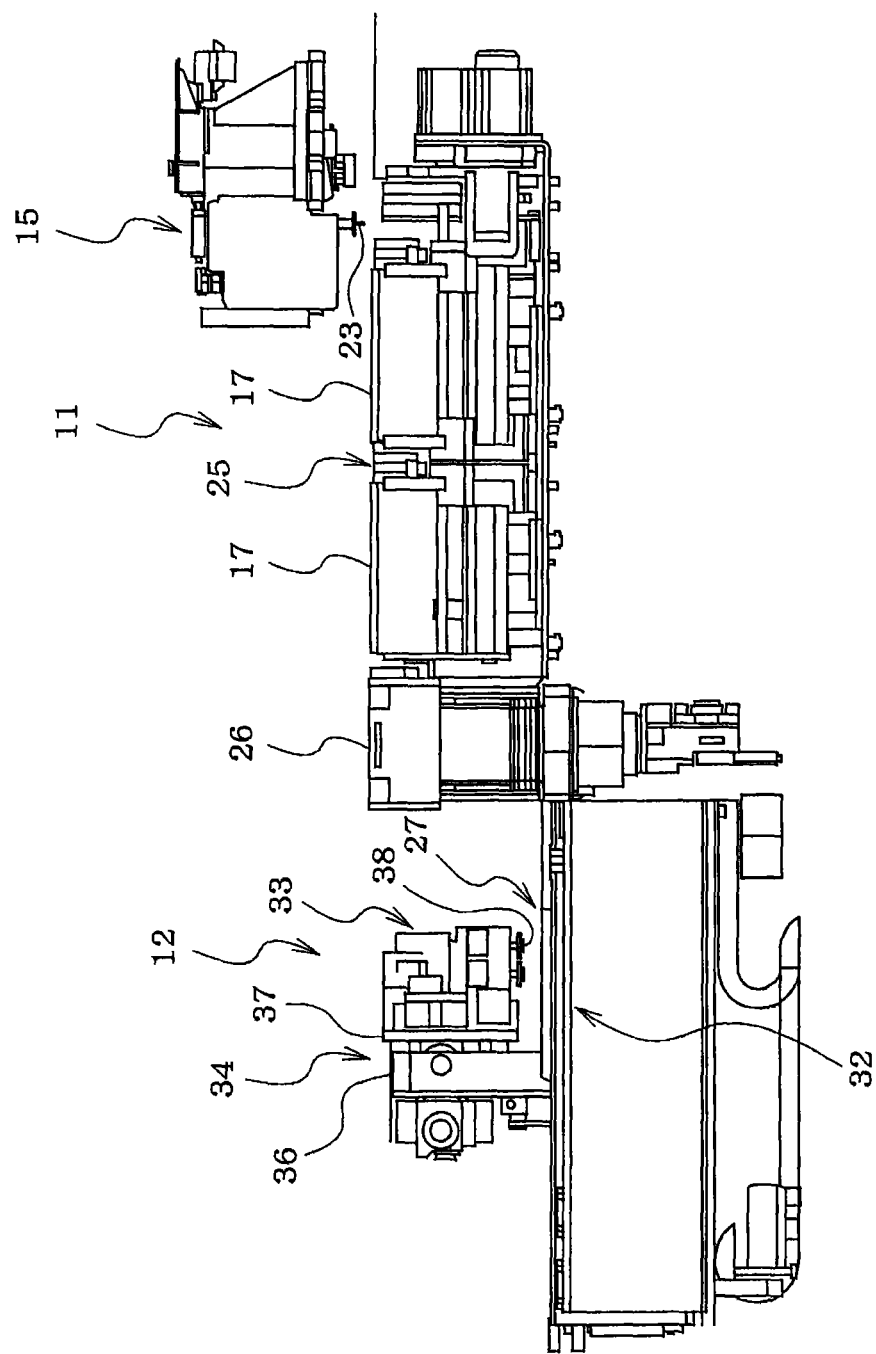
FIG. 6 is a side view showing a state in which a wafer component of a wafer pallet present on the stage of the wafer component supply device is sucked by the supply head.

During the operation of the component mounting machine 11, the operations of the component mounting machine 11, the wafer component supply device 12, and the feeder are controlled according to a production job (production program) by a control device (not shown), and any one of a wafer component 22 supplied from the wafer component supply device 12 and a feeder component supplied from the feeder is sucked and mounted on a circuit substrate 17. In this case, when a wafer component 22 is to be inverted and mounted on the circuit substrate 17, the supply head 33 and the stage 32 of the wafer component supply device 12 are moved down as shown in FIG. 5, the supply head 33 is moved to a position above the wafer pallet 27 as shown in FIG. 6, and the image of the wafer component 22 is taken by the camera 41 and the position of the wafer component 22 is recognized before the wafer component 22 is sucked by the supply head 33. Then, the wafer component 22 is sucked by the supply head 33. After that, the supply head 33 of the wafer component supply device 12 is inverted and inverts the sucked wafer component 22 and the mounting head 15 of the component mounting machine 11 is moved to a position above the supply head 33 as shown in FIG. 7, and the wafer component 22 present on the supply head 33 is sucked and mounted on the circuit substrate 17 by the mounting head 15.

Figure 4:
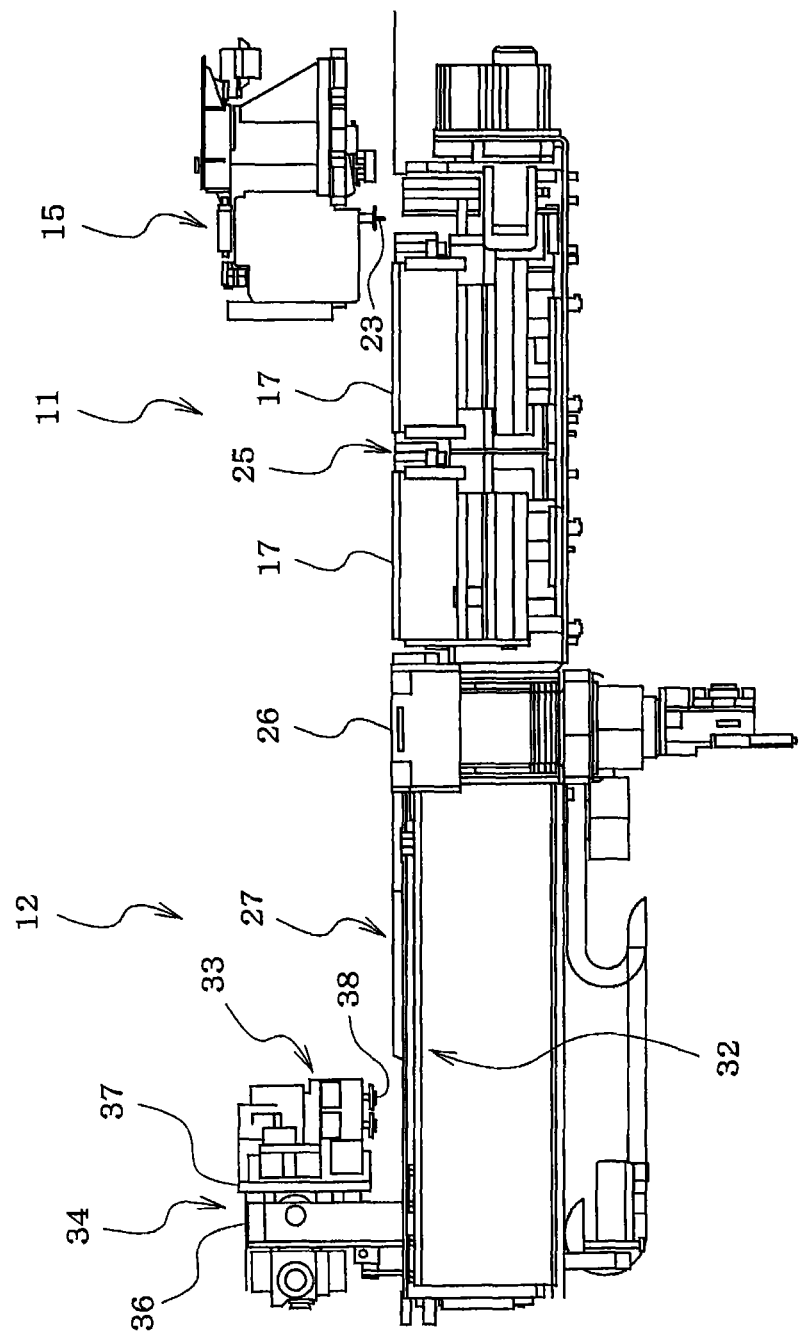
FIG. 4 is a side view showing a height positional relationship between a supply head and the mounting head of the component mounting machine when a stage of the wafer component supply device is moved up.

Incidentally, when an operation for sucking the wafer component 22 by the supply head 33 is performed at the position where the supply head 33 and the stage 32 of the wafer component supply device 12 are moved up as shown in FIG. 4 and an operation for sucking a feeder component by the mounting head 15 of the component mounting machine 11 is performed, the interference (collision) between the mounting head 15 of the component mounting machine 11 and the supply head 33 of the wafer component supply device 12 needs to be avoided. If the heads interfere with each other when the mounting head 15 and the supply head 33 are simultaneously operated as described above, the operation of one head needs to be controlled to stop until the completion of the operation of the other head so that the interference between the heads is prevented. As a result, production efficiency is lowered.

Further, in this embodiment, the order of an operation for inverting a wafer component 22 and mounting the wafer component 22 on a circuit substrate 17 and an operation for mounting a feeder component on the circuit substrate 17 is set so that the supply head 33 and the mounting head 15 do not interfere with each other, and an operation for moving down the supply head 33 and the stage 32, allowing the wafer component 22 to be sucked by the supply head 33, and inverting the wafer component 22 is performed so as to overlap with an operation for sucking and mounting the feeder component by the mounting head 15. On this occasion, image processing for taking the image of the wafer component 22, which is an object to be sucked, by the camera 41 of the supply head 33 and recognizing the position of the wafer component 22 is performed before the wafer component 22 is sucked by the supply head 33.

In this case, the interference between the supply head 33 and the mounting head 15 can be prevented and an operation for processing the image of the wafer component 22 and sucking and inverting the wafer component 22 can be performed so as to overlap with an operation for sucking and mounting the feeder component. Therefore, if the operation for processing the image of the wafer component 22 and sucking and inverting the wafer component 22 is completed by the completion of the operation for sucking and mounting the feeder component, an operation for mounting the wafer component 22 can be started immediately after the completion of the operation for sucking and mounting the feeder component. Alternatively, if the operation for processing the image of the wafer component 22 and sucking and inverting the wafer component 22 is not completed by the completion of the operation for sucking and mounting the feeder component, the operation for mounting the wafer component 22 can be started immediately after the completion of the operation for processing the image of the wafer component 22 and sucking and inverting the wafer component 22. Accordingly, the waiting time for the start of the operation for mounting the wafer component 22 can be reduced, so that production efficiency can be improved.

In this case, when the time, which is required for the operation for processing the image of one wafer component 22 and sucking and inverting the wafer component 22, is longer than the time required for the operation for sucking and mounting one feeder component, a component mounting order is set so that operations for sucking and mounting two or more feeder components are continuously performed until the completion of the operation for processing the image of one wafer component 22 and sucking and inverting the wafer component 22. Accordingly, it is possible to eliminate the waiting time for the start of the operation for mounting the wafer component 22 even when the time, which is required for the operation for processing the image of one wafer component 22 and sucking and inverting the wafer component 22, is longer than the time required for an operation for sucking and mounting one feeder component.

For example, when a component mounting order designated by a production job is an order of a feeder component A, a wafer component 22, and a feeder component B, an operation for sucking and mounting the feeder component A by the mounting head 15 is started, the supply head 33 and the stage 32 are moved down, and an operation for processing the image of the wafer component 22 and sucking and inverting the wafer component 22 is started. When the time, which is required for the operation for processing the image of the wafer component 22 and sucking and inverting the wafer component 22, is shorter than the time required for the operation for sucking and mounting the feeder component A, the operation for processing the image of the wafer component 22 and sucking and inverting the wafer component 22 is completed by the completion of the operation for sucking and mounting the feeder component A. Accordingly, the operation for mounting the wafer component 22 is started immediately after the completion of the operation for sucking and mounting the feeder component A.

In contrast, when the time, which is required for the operation for processing the image of the wafer component 22 and sucking and inverting the wafer component 22, is longer than the time required for the operation for sucking and mounting the feeder component A, the operation for processing the image of the wafer component 22 and sucking and inverting the wafer component 22 is not completed by the completion of the operation for sucking and mounting the feeder component A. For this reason, it is necessary to wait for the start of the operation for mounting the wafer component 22 until the completion of the operation for processing the image of the wafer component 22 and sucking and inverting the wafer component 22 even after the completion of the operation for sucking and mounting the feeder component A.

Accordingly, in the above-mentioned case, a mounting order of the wafer component 22 and the feeder component B is changed into a mounting order of the feeder component A, the feeder component B, and the wafer component 22, an operation for sucking and mounting the first feeder component A is started, the supply head 33 and the stage 32 are moved down, and an operation for processing the image of the wafer component 22 and sucking and inverting the wafer component 22 is started. In this case, an operation for processing the image of one wafer component 22 and sucking and inverting the wafer component 22 can be performed so as to overlap with operations for sucking and mounting two feeder components A and B. Therefore, when the time, which is required for the operation for processing the image of one wafer component 22 and sucking and inverting the wafer component 22, is shorter than the time required for the operations for sucking and mounting the two feeder components A and B, the operation for processing the image of the wafer component 22 and sucking and inverting the wafer component 22 is completed by the completion of the operation for sucking and mounting the second feeder component B. Accordingly, the operation for mounting the wafer component 22 can be started immediately after the completion of the operation for sucking and mounting the second feeder component B. Meanwhile, when the time, which is required for the operation for processing the image of one wafer component 22 and sucking and inverting the wafer component 22, is longer than the time required for the operations for sucking and mounting the two feeder components A and B, the operation for processing the image of one wafer component 22 and sucking and inverting the wafer component 22 may be performed so as to overlap with operations for sucking and mounting three or more feeder components. In this case, it is possible to eliminate the waiting time for the start of the operation for mounting the wafer component 22.

The control device of the component mounting machine 11 includes a storage device (not shown) in which data of the time required for the operation for processing the image of the wafer component 22 and sucking and inverting the wafer component 22 or the time required for the operation for sucking and mounting the feeder component is stored. The control device changes the component mounting order, which is designated by a production job, by using the data so that the operation for processing the image of the wafer component 22 and sucking and inverting the wafer component 22 overlaps with the operation for sucking and mounting the feeder component.

Meanwhile, when a production job is created, a component mounting order may be set so that the operation for processing the image of the wafer component 22 and sucking and inverting the wafer component 22 overlaps with the operation for sucking and mounting the feeder component.

Further, in the present disclosure, the start of the operation for mounting the wafer component 22 may wait until the completion of the operation for processing the image of the wafer component 22 and sucking and inverting the wafer component 22 when the time, which is required for the operation for processing the image of one wafer component 22 and sucking and inverting the wafer component 22, is longer than the time required for the operation for sucking and mounting one feeder component (or two feeder components). Even in this case, it is possible to reduce the waiting time for the start of the operation for mounting the wafer component 22 by the time which is required for the operation for sucking and mounting one feeder component (or two feeder components), in comparison with a case in which the operation for processing the image of the wafer component 22 and sucking and inverting the wafer component 22 does not overlap with the operation for sucking and mounting the feeder component. As a result, it is possible to improve production efficiency.

In addition, the present disclosure is not limited to the above-mentioned embodiments, and it goes without saying that the structure of the component mounting machine 11 or the wafer component supply device 12 may be appropriately modified without departing from the scope of the present disclosure.

REFERENCE SIGNS LIST

11: component mounting machine
12: wafer component supply device
13: feeder setting base
15: mounting head
16: X-Y moving mechanism
17: circuit substrate
22: wafer component
23: suction nozzle
25: conveyor
26: part camera
27: wafer pallet
28: magazine
29: dicing sheet
32: stage
33: supply head
34: X-Y moving mechanism
35: drawing mechanism
38: suction nozzle
39: inverting mechanism
41: camera
42: knock-up mechanism

The invention claimed is:

1. A system for controlling a component mounting machine, comprising:
a wafer component supply device, which supplies a wafer component formed by dicing one wafer attached onto a dicing sheet, and a feeder, which supplies an electronic component, in a component mounting machine and controlling operations of the component mounting machine, the wafer component supply device, and the feeder according to a production job to suck any one of the wafer component supplied from the wafer component supply device and a feeder component supplied from the feeder and mount any one of the wafer component and the feeder component on a circuit substrate, wherein
the component mounting machine includes a mounting head that sucks any one of the wafer component and the feeder component supplied from the wafer component supply device and the feeder and mounts any one of the wafer component and the feeder component on the circuit substrate,
the wafer component supply device includes a supply head that sucks and inverts the wafer component and a vertical movement mechanism that moves the supply head in a vertical direction integrally with a stage on which a pallet for the wafer component is set,
when the wafer component is to be inverted and mounted on the circuit substrate, the wafer component present on the inverted supply head is sucked by the mounting head of the component mounting machine at a position where the supply head and the stage are moved down by the vertical movement mechanism, and
when the wafer component is to be mounted on the circuit substrate without being inverted, the wafer component present on the stage is sucked by the mounting head of the component mounting machine at a position where the supply head and the stage are moved up by the vertical movement mechanism, and
the system includes control means for setting an order of an operation for inverting the wafer component and mounting the wafer component on the circuit substrate and an operation for mounting the feeder component on the circuit substrate so that the supply head and the mounting head do not interfere with each other and for performing an operation for moving down the supply head and the stage, allowing the wafer component to be sucked by the supply head, and inverting the wafer component so that the operation overlaps with an operation for sucking and mounting the feeder component by the mounting head.

2. The system for controlling a component mounting machine according to claim 1,
wherein when a time, which is required for an operation for sucking and inverting one wafer component by the supply head, is longer than time required for an operation for sucking and mounting one feeder component by the mounting head, the control means sets a component mounting order so that operations for sucking and mounting two or more feeder components are continuously performed until the completion of the operation for sucking and inverting the wafer component.

3. The system for controlling a component mounting machine according to claim 1,
wherein the wafer component supply device includes a camera that takes an image of the wafer component before sucking the wafer component by the supply head, and is adapted to recognize the position of the wafer component through processing of the image taken by the camera and to suck the wafer component by the supply head.

4. The system for controlling a component mounting machine according to claim 1,
wherein the wafer component supply device includes a knock-up mechanism for knocking up a portion of the dicing sheet, which is to be sucked by the supply head, from below when the wafer component is sucked by the supply head.

5. A method of controlling a component mounting machine, the method setting a wafer component supply device, which supplies a wafer component formed by dicing one wafer attached onto a dicing sheet, and a feeder, which supplies an electronic component, in a component mounting machine and controlling operations of the component mounting machine, the wafer component supply device, and the feeder according to a production job to suck any one of the wafer component supplied from the wafer component supply device and a feeder component supplied from the feeder and mount any one of the wafer component and the feeder component on a circuit substrate, wherein the component mounting machine includes a mounting head that sucks any one of the wafer component and the feeder component supplied from the wafer component supply device and the feeder and mounts any one of the wafer component and the feeder component on the circuit substrate, the wafer component supply device includes a supply head that sucks and inverts the wafer component and a vertical movement mechanism that moves the supply head in a vertical direction integrally with a stage on which a pallet for the wafer component is set, when the wafer component is to be inverted and mounted on the circuit substrate, the wafer component present on the inverted supply head is sucked by the mounting head of the component mounting machine at a position where the supply head and the stage are moved down by the vertical movement mechanism, and when the wafer component is to be mounted on the circuit substrate without being inverted, the wafer component present on the stage is sucked by the mounting head of the component mounting machine at a position where the supply head and the stage are moved up by the vertical movement mechanism, the method comprising:
setting an order of an operation for inverting the wafer component and mounting the wafer component on the circuit substrate and an operation for mounting the feeder component on the circuit substrate so that the supply head and the mounting head do not interfere with each other; and
performing an operation for moving down the supply head and the stage, allowing the wafer component to be sucked by the supply head, and inverting the wafer component so that the operation overlaps with an operation for sucking and mounting the feeder component by the mounting head.

6. A system for controlling a component mounting machine, comprising:
a wafer component supply device, which supplies a wafer component formed by dicing one wafer attached onto a dicing sheet, and a feeder, which supplies an electronic component, in a component mounting machine and controlling operations of the component mounting machine, the wafer component supply device, and the feeder according to a production job to suck any one of the wafer component supplied from the wafer component supply device and a feeder component supplied from the feeder and mount any one of the wafer component and the feeder component on a circuit substrate, wherein
the component mounting machine includes a mounting head that sucks any one of the wafer component and the feeder component supplied from the wafer component supply device and the feeder and mounts any one of the wafer component and the feeder component on the circuit substrate,
the wafer component supply device includes a supply head that sucks and inverts the wafer component and a vertical movement mechanism that moves the supply head in a vertical direction integrally with a stage on which a pallet for the wafer component is set,
when the wafer component is to be inverted and mounted on the circuit substrate, the wafer component present on the inverted supply head is sucked by the mounting head of the component mounting machine at a position where the supply head and the stage are moved down by the vertical movement mechanism, and
when the wafer component is to be mounted on the circuit substrate without being inverted, the wafer component present on the stage is sucked by the mounting head of the component mounting machine at a position where the supply head and the stage are moved up by the vertical movement mechanism, and
the system includes circuitry configured to set an order of an operation for inverting the wafer component and mounting the wafer component on the circuit substrate and an operation for mounting the feeder component on the circuit substrate so that the supply head and the mounting head do not interfere with each other and for performing an operation for moving down the supply head and the stage, allowing the wafer component to be sucked by the supply head, and inverting the wafer component so that the operation overlaps with an operation for sucking and mounting the feeder component by the mounting head.

* * * * *